United States Patent [19]
Ternullo, Jr.

[11] Patent Number: 6,133,748
[45] Date of Patent: *Oct. 17, 2000

[54] CROW-BAR CURRENT REDUCTION CIRCUIT

[75] Inventor: Luigi Ternullo, Jr., San Jose, Calif.

[73] Assignee: Vanguard International Semiconductor Corp, Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/036,726

[22] Filed: Mar. 6, 1998

[51] Int. Cl.[7] .......................... H03K 19/003; H03K 19/02
[52] U.S. Cl. .................................. 326/21; 326/27; 326/58
[58] Field of Search .................................. 326/21, 26–27, 326/56–58, 83, 86, 112, 119, 121, 88

[56] References Cited

U.S. PATENT DOCUMENTS

| | | | |
|---|---|---|---|
| 5,165,046 | 11/1992 | Hesson | 327/111 |
| 5,210,449 | 5/1993 | Nishino et al. | 326/57 |
| 5,239,214 | 8/1993 | Segawa et al. | 324/253 |
| 5,568,081 | 10/1996 | Lui et al. | 327/380 |
| 5,594,380 | 1/1997 | Nam | 327/390 |

*Primary Examiner*—Michael Tokar
*Assistant Examiner*—James H. Cho
*Attorney, Agent, or Firm*—Jiawei Huang; J.C. Patents

[57] ABSTRACT

A crow-bar current reduction circuit for use with a NMOS output circuit a gate voltage control circuit (GVC). The GVC receives a data signal and an output enable signal and generates control signals to drive the gates of the output transistors of the output circuit. When enabled, the GVC delays the rising edges of the gate control signals so as to help ensure that during a transition of the output signal generated by the output circuit, the NFET that was conductive before the transition is "turned off" to become non-conductive before the NFET that was non-conductive before the transition is "turned on" to become conductive. When adapted for a CMOS output circuit, the GVC delays the rising edge of the gate control signal provided to the NMOS pull-down transistor and delays the falling edge of gate control signal provided to the PMOS pull-up transistor.

26 Claims, 5 Drawing Sheets

— 6,133,748

CROW-BAR CURRENT REDUCTION CIRCUIT

FIELD OF THE INVENTION

The present invention relates to output circuits for integrated circuit devices and, more particularly, to output circuits with reduced crow-bar current.

BACKGROUND

Integrated circuits typically include output circuits for driving data signals onto buses or input/output (I/O) pins. These output circuits generally have three states, namely a high state, a low state and a high-impedance state. The output circuit enters the high and low states in response to a data (d) signal when enabled, and enters the high impedance state in response to an output-enable (oe) signal. For low voltage TTL technology, in the high state, the output circuit provides a logic high output signal (e.g., a voltage of greater than 2.4 volts) at an output node. In the low state, the output circuit provide a logic low output signal (e.g., a voltage of less than 0.4 volts) at the output node. In the high-impedance state, the output circuit presents a high impedance (e.g., four hundred KΩ or greater) to the output node to allow other output circuits to drive the bus or I/O pin.

A typical three-state output circuit includes a pull-up transistor and a pull-down transistor connected with their channel regions in series between a supply voltage source (POWER) and a ground source (GROUND). The node connecting the channel regions of the pull-up and pull-down transistors serves as the output node. When the output circuit is in the high state, the pull-up transistor is conductive while the pull-down transistor is non-conductive, thereby electrically connecting the output node to POWER. In contrast, when the output circuit is in the low state, the pull-down transistor is conductive while the pull-up transistor is non-conductive, thereby electrically connecting the output node to GROUND. However, when the output circuit is in the high-impedance state, both the pull-up and pull-down transistors (i.e., the output transistors) are in the non-conductive state. The output circuit typically enters the high-impedance state when the oe signal is de-asserted.

However, when a conventional output circuit transitions from the high state to the low state (and vice versa), both of the output transistors can be conductive. When both of the output transistors are conductive, a direct current path is formed between the supply and ground sources through the pull-up and pull-down transistors. This condition is undesirable because it allows a current (i.e., the "crow-bar" current) to flow between POWER and GROUND, thereby wasting power and, in extreme cases, introducing switching noise in the power supply buses or damaging the output transistors.

SUMMARY

In accordance with the present invention, a crow-bar current reduction circuit is provided. In one aspect of the present invention adapted for use with a n-channel field effect transistor (NFET) output circuit, the crow-bar current reduction circuit includes a gate voltage control circuit (GVC). The GVC receives a data signal and an output enable signal and generates control signals to drive the gates of the output transistors of the output circuit. When enabled, the GVC delays the rising edges of the gate control signals so as to help ensure that during a transition of the output signal generated by the output circuit, the NFET that was conductive before the transition is "turned off" to become non-conductive before the NFET that was non-conductive before the transition is "turned on" to become conductive. In this manner, the GVC helps prevent the formation of a direct current path through the output transistors, thereby reducing crow-bar current.

In addition, the delay on the "activation" edge does not significantly affect the speed of the output circuit in generating a transition in the output signal at the output node. This occurs because the added delay on the activation edges is offset by the increased speed in pulling up (or pulling down) the voltage at the output node due to the reduction in crow-bar current. More specifically, by turning off an output transistor before turning on the other output transistor, the turned on transistor does not "fight" the other transistor in pulling up (or pulling down) the voltage at the output node.

In another aspect of the present invention adapted for use with a complementary metal-oxide-semiconductor (CMOS) output circuit, the GVC delays the rising edge of the gate control signal provided to the pull-down transistor of the CMOS output circuit and delays the falling edge of gate control signal provided to the pull-up transistor of the CMOS output circuit. Thus, the GVC helps ensure that during a transition of the output signal generated by the output circuit, the output transistor that was conductive before the transition is "turned off" to become non-conductive before the output transistor that was non-conductive before the transition is "turned on" to become conductive.

DETAILED DESCRIPTION

Figure 1:
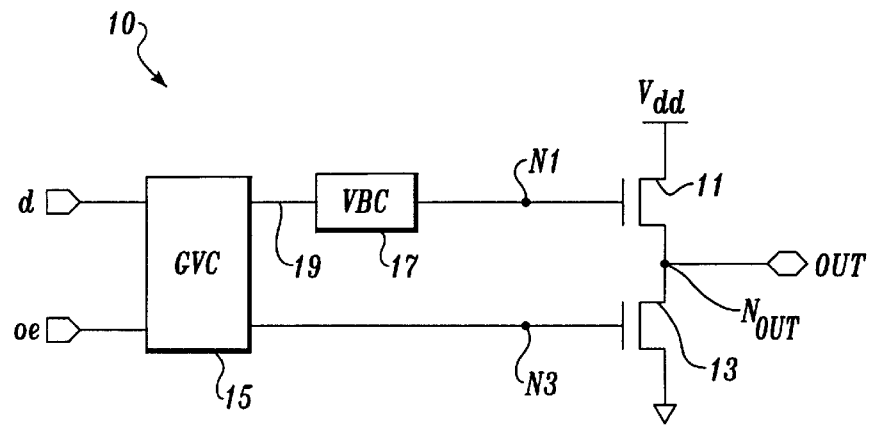
FIG. 1 is a block diagram illustrative of a crow-bar current reduction circuit for use with a NFET output circuit, according to one embodiment of the present invention.

FIG. 1 is a block diagram illustrative of a crow-bar current reduction circuit 10 for use with a NFET (n-channel field effect transistor) output circuit, according to one embodiment of the present invention. The NFET output circuit is implemented with n-channel metal-oxide-semiconductor field effect transistors (MOSFETs) 11 and 13. The term MOSFET is used herein to include silicon gate technologies. In accordance with the present invention, circuit 10 includes a gate voltage control circuit (GVC) 15 and a voltage boost circuit (VBC) 17.

The circuitry is interconnected as follows. GVC 15 is connected to receive the data (d) and output enable (oe) signals. GVC 15 has two output leads, one connected to the gate of NMOSFET 13 through a node N3 and the other connected to a control connection 19 of VBC 17. VBC 17 is connected to receive a boost voltage $V_{bst}$ from a voltage booster (not shown). VBC 17 also has an output lead connected to the gate of NMOSFET 11 through a node N1. The drain of NMOSFET 11 is connected to a voltage bus providing a voltage $V_{dd}$ (i.e., the $V_{dd}$ bus) whereas the source of NMOSFET 11 is connected to the drain of NMOSFET 13 through an output node $N_{out}$. The source of NMOSFET 13 is connected to a ground bus.

In accordance with the present invention, circuit 10 operates as follows. GVC 15 is configured so that when signal oe is deasserted, GVC 15 causes the voltage levels at nodes N1 (via VBC 17) and N3 to be at a logic low level. The logic low levels at nodes N1 and N3 cause NMOSFETs 11 and 13 to be non-conductive. With regard to controlling the voltage at node N1, GVC 15 provides a control signal via the control connection 19 that causes VBC 17 to drive the voltage at node N1 to a logic low level when signal oe is deasserted. Because NMOSFETs 11 and 13 are both non-conductive, circuit 10 presents a high-impedance at output node $N_{out}$, allowing other output circuits (not shown) that are electrically connected to node $N_{out}$ to drive the voltage at output node $N_{out}$.

When signal oe is asserted, GVC 15 is configured to drive the voltage at node N1 to match the logic level of data signal d, through VBC 17. In addition, GVC 15 is configured to drive the voltage at node N3 to be the complement of data signal d. Moreover, in accordance with the present invention, GVC 15 is configured to control transitions of the voltages at nodes N1 and N3 so that NMOSFETs 11 and 13 are not conductive at the same time, thereby reducing crow-bar current through the output transistors.

In particular, GVC 15 is configured to so that when data signal d transitions from a logic low level to a logic high level (i.e., a low-to-high transition), GVC 15 causes the low-to-high transition of the voltage at node N1 (via VBC 17) to be delayed relative to the high-to-low transition of the voltage at node N3. Likewise, a high-to-low transition of data signal d causes GVC 15 to delay the low-to-high transition of the voltage at node N3 to be delayed relative to the high-to-low transition of the voltage at node N1. Stated another way, during a transition of the voltage at node $N_{out}$, the NMOSFET that was conductive before the transition is "turned off" to become non-conductive before the NMOSFET that was non-conductive before the transition is "turned on" to become conductive. In this manner, circuit 10 helps prevent the formation of a direct current path through the output transistors, thereby reducing crow-bar current.

Although in this embodiment the low-to-high transitions of the gate voltages of the output transistors are delayed, there is no significant loss of speed in transitions of the output signal at node $N_{out}$. This occurs because the presence of crow-bar current slows down the transitions of the output signal. For example, if NMOSFET 11 is conductive during a low-to-high transition of the output signal at node $N_{out}$ (i.e., the crow-bar current condition), NMOSFET 11 must "fight" NMOSFET 13 in pulling up the output voltage at node $N_{out}$. However, in accordance with the present invention, NMOSFET 13 is turned off before turning on NMOSFET 11 during a low-to-high transition of the output signal. As a result, NMOSFET 11 does not have to "fight" NMOSFET 13 to pull up the voltage and, thus, can more quickly pull up the voltage. Accordingly, the reduction in crow-bar current in effect offsets the delay added to the activation edges of the gate voltages of the output transistors.

Turning now to VBC 17, in response to the control signal provided by GVC 15 via connection 19, VBC 17 is configured to output either a logic high level or logic low level at node N1 as described in above. More particularly, VBC 17 is configured to provide a logic high level at node N1 with a voltage (i.e., $V_{bst}$) that is "boosted" to be at least equal to a threshold voltage (of NMOSFET 11) greater than voltage $V_{dd}$. This scheme allows NMOSFET 11 to "pull up" the voltage at output node $N_{out}$ all the way to voltage $V_{dd}$ for improved signal driving performance. It will be appreciated by those skilled in the art of NFET output circuits that the boosted voltage $V_{bst}$ is not constant. Instead, voltage $V_{bst}$ has a value greater than the value of voltage Vdd only when necessary to turn on NMOSFET 11 (e.g., when data signal d is at a logic high level). Conversely, voltage $V_{bst}$ has of $V_{dd}$ or lower when NMOSFET 11 is to be turned off (e.g., when data signal d is at a logic low level). Reducing the value of voltage $V_{bst}$ allows a logic high output signal from NAND gate 21 to turn off PMOSFET 28.

Figure 2:
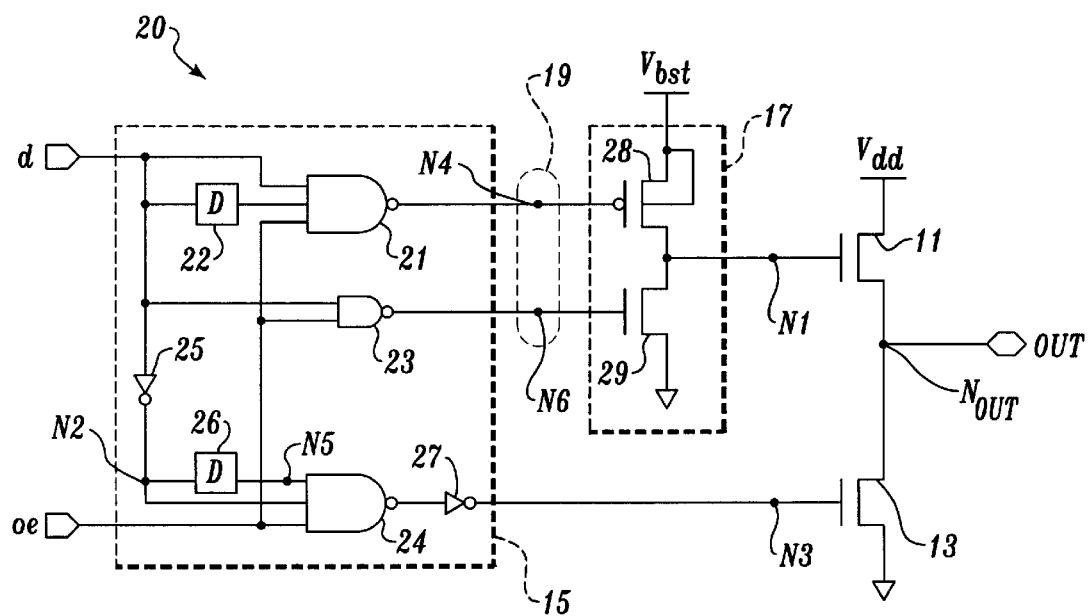
FIG. 2 is a schematic diagram illustrative of a crow-bar current reduction circuit implementing the circuit of FIG. 1, according to one embodiment of the present invention.

FIG. 2 is a schematic diagram illustrative of a crow-bar current reduction circuit 20, according to one embodiment of the present invention. In this embodiment, GVC 15 is implemented with NAND gates 21, 23 and 24, delay circuits 22 and 26, and inverters 25 and 27. VBC 17 is implemented with a complementary metal-oxide-semiconductor (CMOS) inverter formed by a PMOSFET 28 and a NMOSFET 29.

Circuit 20 is interconnected as follows. NAND gate 21 is a three-input NAND gate having one input lead connected to receive data signal d, a second input lead connected to receive a delayed version of data signal d through delay circuit 22, and a third input lead connected to receive signal oe. NAND gate 21 also has an output lead connected to the gate of PMOSFET 28 of VBC 17, via a node N4.

NAND gate 23 is a two-input NAND gate having a first input lead connected to receive the data signal d and a second input lead connected to receive the signal oe. NAND gate 23 also has an output lead connected to the gate of NMOSFET 29 of VBC 17, via a node N6.

NAND gate 24 is a three-input NAND gate having a first input lead connected to receive the complement of data signal d via inverter 25 through a node N2, a second input lead connected to receive a delayed version of the complemented data signal d through delay circuit 26, and a third input lead connected to receive signal oe. NAND gate 24 also has an output lead connected to the input lead of inverter 27. The output lead of inverter 27 is connected to the gate of NMOSFET 13 through a node N3.

Circuit 20 operates as follows. When signal oe is deasserted (i.e., at a logic low level in this embodiment), the NAND gates 21, 23 and 24 each output a logic high level signal. In response to the logic high level signals from NAND gates 21 and 23, PMOSFET 28 is turned off and NMOSFET 29 is turned on, thereby pulling down the voltage at node N1 to turn off NMOSFET 11. The logic high level signal from NAND gate 24 is converted to a logic low level by inverter 27, thereby turning off NMOSFET 13. Thus, both of the output transistors are non-conductive in response to the deasserted oe signal.

However, when the oe signal is asserted: NAND gate 21 functions essentially as an inverter receiving a delayed version of data signal d (due to delay circuit 22); NAND gate 23 functions essentially as an inverter receiving data signal d; and NAND gate 24 functions essentially as an inverter receiving the complement of data signal d (due to inverter 25 and delay circuit 26). Thus, NAND gate 21 provides the same output signal as NAND gate 23, except that NAND gate 21 delays the falling edge of its output signal by a duration equivalent to the delay of delay circuit 22. Similarly, delay circuit 26 delays the falling edge of the output signal of NAND gate 24. By delaying the falling edges of the output signals generated by NAND gates 21 and 24, the rising edges (due to inverting effects caused by VBC 17 and inverter 27) of the signals driving the gates of NMOSFETs 11 and 13 are delayed. By properly setting the delays of delay circuits 22 and 26 (e.g., through conventional modeling analysis using commercially available modeling/simulation tools such as HSPICE), GVC 15 operates to ensure that, in response to a high-to-low transition of data signal d, NMOSFET 11 will begin to turn off before NMOSFET 13 begins to turn on and, conversely, in response to a low-to-high transition of data signal d, NMOSFET 13 will begin to turn off before NMOSFET 11 begins to turn on.

Thus, when data signal d has a low-to-high transition, NAND gates 21 and 23 provide high-to-low transitions of the signals provided to VBC 17, with NAND gate 21 delaying the falling edge of the signal provided to PMOSFET 28. The high-to-low transitions cause NMOSFET 29 turns off and, after the delay period, PMOSFET 28 to turn on, thereby pulling up the voltage at node N1 with little or no crow-bar current through VBC 17. The logic high level at node N1 then causes NMOSFET 11 to turn on. Conversely, inverter 25 causes NAND gate 24 to receive a complemented version of data signal d, which causes NAND gate 24 to generate a low-to-high transition of the signal provided to inverter 27. Thus, inverter 27 causes a high-to-low transition of the signal at node N3, thereby turning off NMOSFET 13. Because of the delay introduced by delay circuit 22, NMOSFET 11 is turned on after NMOSFET 13 is turned off, thereby reducing crow-bar current through the output transistors, as described above.

Similarly, when data signal d has a highto-low transition, NAND gates 21 and 23 provide transitions of the signals provided to VBC 17. The low-to-high transitions cause NMOSFET 29 turns on and PMOSFET 28 to turn off, thereby pulling down the voltage at node N1. The logic low level at node N1 then causes NMOSFET 11 to turn off. Conversely, inverter 25 causes NAND gate 24 to receive input signals with a low-to-high transition, causing NAND gate 24, after the delay caused by delay circuit 26, to generate a high-to-low transition of the signal provided to inverter 27. Thus, inverter 27 causes a low-to-high transition of the signal at node N3, thereby turning on NMOSFET 13. Because of the delay introduced by delay circuit 26, NMOSFET 13 is turned on after NMOSFET 11 is turned off, thereby reducing crow-bar current through the output transistors, as described above.

Figure 3:
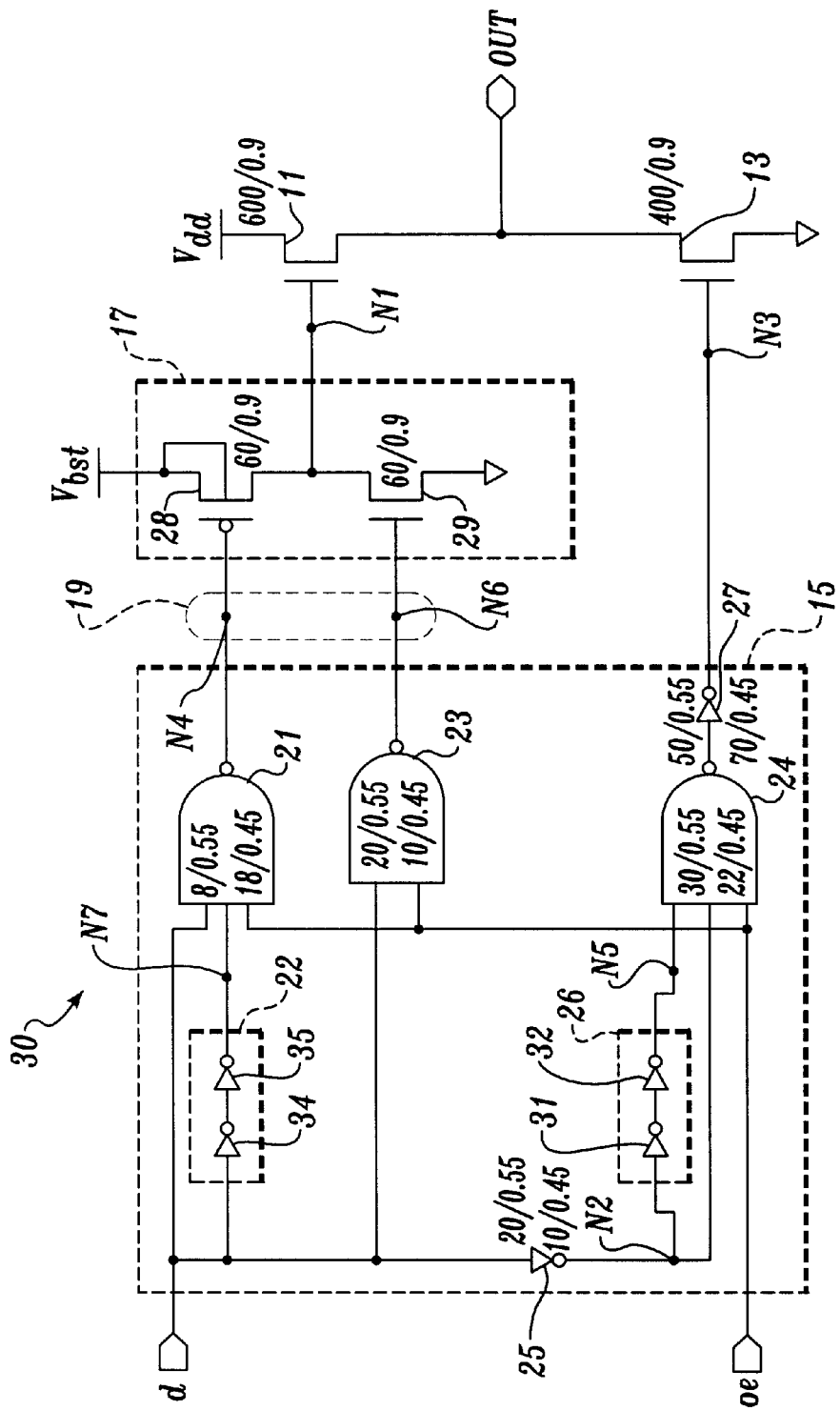
FIG. 3 is a more detailed schematic diagram of the crow-bar current reduction circuit of FIG. 2, according to one embodiment of the present invention.

FIG. 3 is a schematic diagram of the crow-bar current reduction circuit 30, according to another embodiment of the present invention. Circuit 30 is essentially a more detailed schematic of circuit 20 (FIG. 2), with FIG. 3 indicating the transistor sizes (i.e., width-to-length ratios) and that delay circuits 22 and 26 are each implemented with two cascaded inverters.

Delay circuit 26 is implemented with inverters 31 and 32, whereas delay circuit 22 is implemented with inverters 34 and 35. Delay circuits 22 and 26 need not be identical. Instead, inverters 31 and 32 may be skewed so as to achieve a desired delay for delay circuit 22. Likewise, inverters 34 and 35 may be skewed so as to achieve a desired delay for delay circuit 26. For clarity, the device sizes for inverter 31, 32, 34 and 35 are omitted from FIG. 3 and listed below in Table 1.

TABLE 1

| Inverter | p-channel | n-channel |
|----------|-----------|-----------|
| 31 | 4.2/0.55 | 2.1/0.45 |
| 32 | 4.2/0.7 | 2.1/0.7 |
| 34 | 4.2/0.7 | 2.1/0.6 |
| 35 | 4.2/0.6 | 2.1/0.6 |

NAND gates 21 and 23 are skewed so as to reduce crow-bar current in VBC 17. In this case, the capacitance of the MOSFETs 28 and 29 is relatively small and, as a result, there is relatively little delay in transitioning the voltages at nodes N4 and N6. Thus, crow-bar current through MOSFETs 28 and 29 can be significantly reduced by skewing NAND gate 21 so that high-to-low output signal transitions are faster than low-to-high output signal transitions (i.e., so that PMOSFET 28 turns off faster than it turns on) and NAND gate 23 so that low-to-high output signal transitions are faster than high-to-low output signal transitions (i.e., so that NMOSFET 29 turns off faster than it turns on).

In contrast, the NMOSFETs 11 and 13 are relatively large so as to drive the output load (e.g., the bus line capacitance) and, thus, have a relatively large capacitance. Consequently, the delay in transitioning the voltages at nodes N1 and N3 is large enough so that the relatively small delays provided by skewing the NAND gates do not ensure that output transistors will not be conductive at the same time. Thus, GVC 15 includes delay circuits 22 and 26 to reduce crossbar current through the output transistors as described above in conjunction with FIG. 2.

Figure 4:
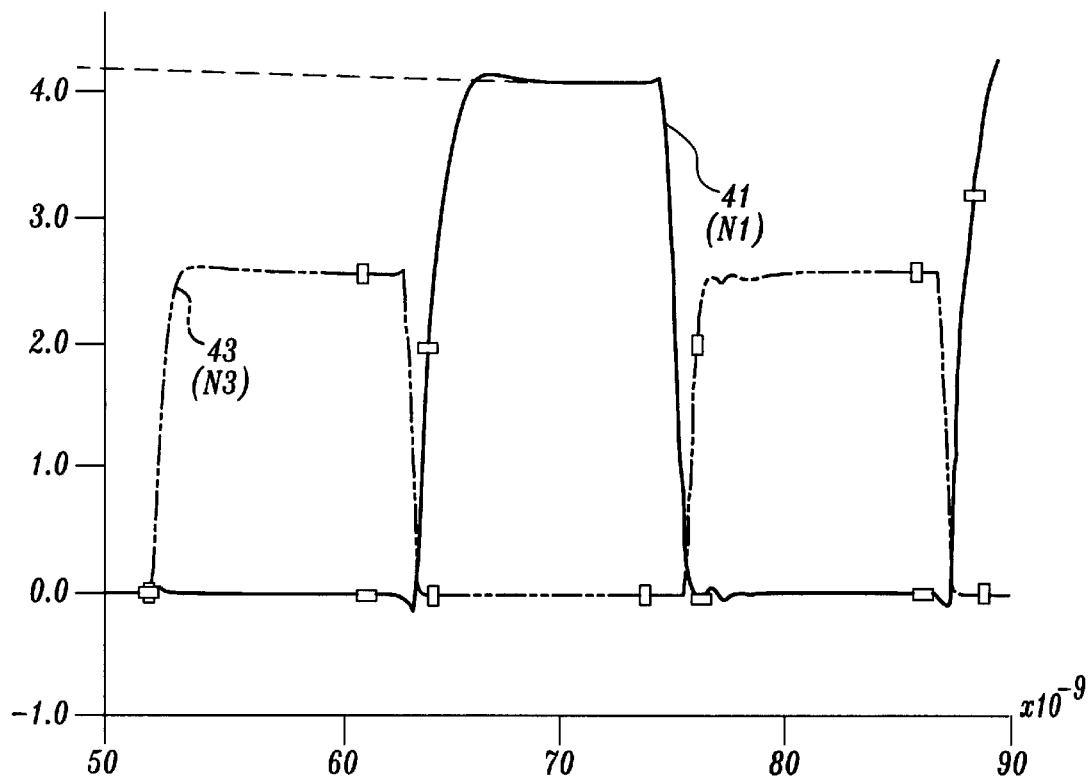
FIGS. 4–6 are timing diagrams illustrative of the operation of the crow-bar current reduction circuit of FIG. 3.
Figure 5:
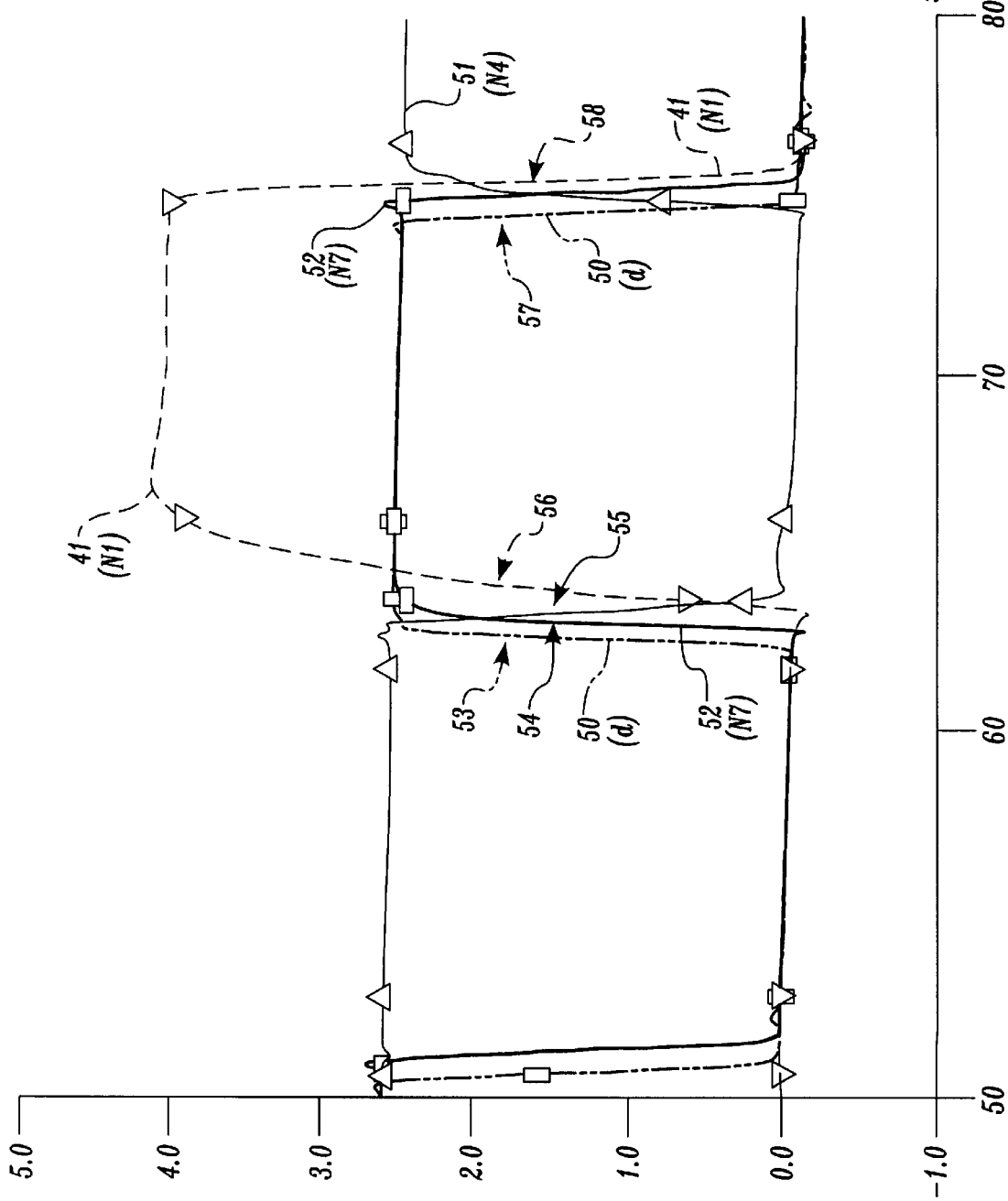
Figure 6:
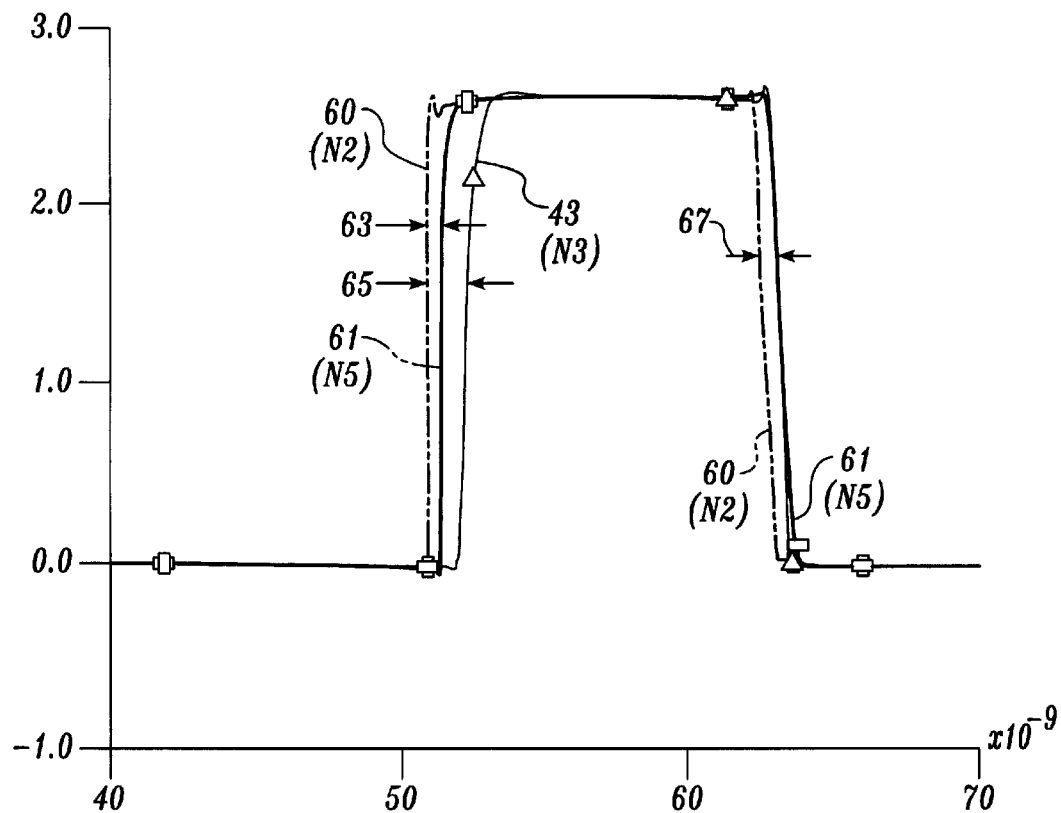

FIGS. 4–6 are timing diagrams illustrative of the operation of circuit 30 (FIG. 3) when the signal oe is asserted. FIG. 4 illustrates the gate voltages of output transistors 11 and 13 as provided by GVC 15. The voltage at node N1 (i.e., the gate voltage of NMOSFET 11) is represented by a waveform 41, whereas the voltage at node N3 (i.e., the gate voltage of NMOSFET 13) is represented by a waveform 43. As can be seen, GVC 15 generates waveforms 41 and 43 to be essentially non-overlapping. More specifically, waveforms 41 and 43 intersect at voltages substantially below the threshold voltages (i.e., about 0.5 to 0.7 volts) of the output transistors. In this embodiment, waveforms 41 and 43 intersect at about 0.1 to 0.2 volts. Because waveforms 41 and 43 are essentially non-overlapping, NMOSFETs 11 and 13 are prevented from being in the conductive state at the same time, thereby reducing crow-bar current.

FIG. 5 illustrates the timing of pull-up path in the output transistors NMOSFETs 11 and 13. Data signal d is represented by a waveform 50, whereas the output signal generated by NAND gate 21 at node N1 is represented by a waveform 51. In addition, the output signal generated by delay circuit 22 at node N7 is represented by a waveform 52. In response to a low-to-high transition of data signal d (as indicated in waveform 50 by arrow 53), delay circuit 22 (FIG. 3) causes (after a delay of about 0.2–0.35 nanoseconds) a low-to-high transition of the voltage at node N7, as indicated in waveform 52 by arrow 54. In response to the low-to-high transition of waveform 52, NAND gate 21 (FIG. 3) causes the voltage at node N4 to begin a high-to-low transition, as indicated in waveform 51 by arrow 55. The low-to-high transition of waveform 51 causes PMOSFET 28 (FIG. 3) to turn on and begin pulling up the voltage at node N1, as indicated in waveform 41 by arrow 56. Conversely, a high-to-low transition of data signal d (as indicated in waveform 50 by arrow 57) causes a high-to-low transition of the voltage at node N1 (as indicated in waveform 41 by arrow 58) through NAND gate 21. Because NAND gate 21 will perform a low-to-high transition in direct response to any of its input signals transitioning to a logic low level, the delay of a high-to-low transition of waveform 41 (relative to high-to-low transition of waveform 50) is significantly less than the delay of a low-to-high transition of waveform 41 (relative to low-to-high transition of waveform 50).

FIG. 6 illustrates the timing of pull-down path in the output transistors NMOSFETs 11 and 13. The output signal generated by inverter 25 (FIG. 3) is represented by a waveform 60, whereas the output signal generated by delay circuit 26 (FIG. 3) is represented by a waveform 61. Thus, in response to the low-to-high transition of waveform 61, NAND gate 24 (FIG. 3) generates an output signal with a high-to-low transition, which is received by inverter 27 (FIG. 3). The delay caused by delay circuit 26 is about 0.25–0.4 nanoseconds, as indicated by arrows 63. Inverter 27 then inverts the NAND gate output signal, causing a low-to-high transition in waveform 43 (i.e., node N3). In addition, inverter 27 is also skewed to achieve slower low-to-high transitions (and thereby faster high-to-low transitions) of the voltage at node N3. Consequently, NMOSFET 13 turns on more slowly, thereby reducing noise (e.g., ground bounce) at output node $N_{out}$. Due to delay circuit 22 and the skewing of inverter 27, the low-to-high transition of waveform 43 is relatively slow, as indicated by arrows 65, thereby illustrating the delay inserted on the rising edge of the output signal of NAND gate 21.

Conversely, in response to a high-to-low transition of waveform 60, NAND gate 24 directly causes a low-to-high transition in the signal received by inverter 27. Because NAND gate 24 by-passes the delay of delay circuit 26 and inverter 27 is skewed, inverter 27 relatively quickly generates a high-to-low transition in waveform 43, as indicated by arrows 67. As can be seen by the sets of arrows 65 and 67, the delay of a low-to-high transition in waveform 43 is significantly greater than a high-to-low transition, relative to the corresponding transitions of waveform 60, thereby illustrating the delay inserted on the rising edge of the output signal of NAND gate 24.

Figure 7:
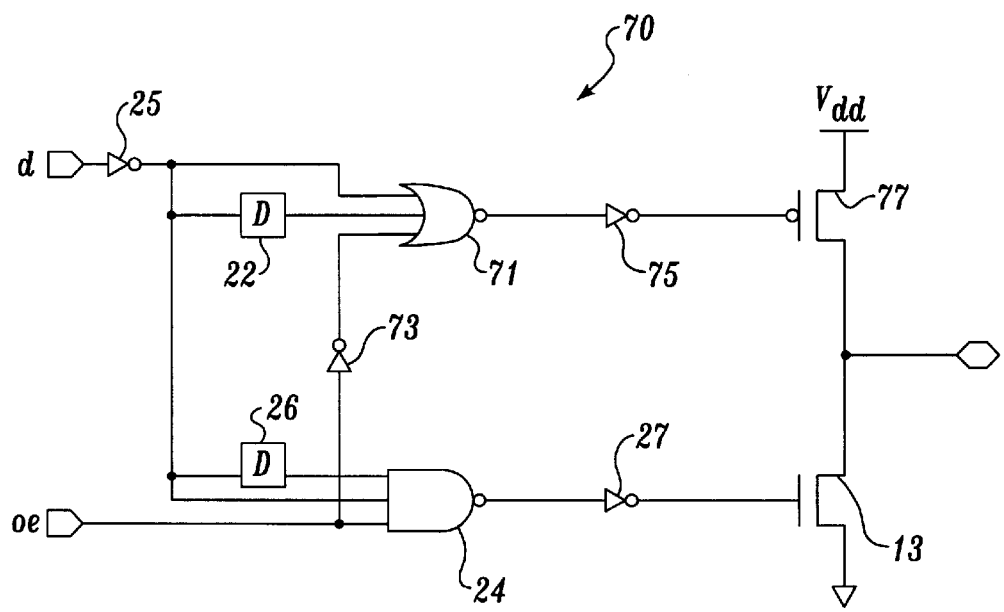
FIG. 7 is a schematic diagram illustrative of a crow-bar reduction circuit for use with a CMOS output circuit, according to one embodiment of the present invention.

FIG. 7 is a schematic diagram illustrative of a crow-bar reduction circuit 70 for use with a CMOS output circuit, according to one embodiment of the present invention. The CMOS output circuit is implemented with a PMOSFET 77 and NMOSFET 13, having their channel regions connected between the $V_{dd}$ source and GROUND in the conventional manner. Circuit 70 is similar to circuit 20 (FIG. 2) except that VBC 17 is deleted and a NOR gate 71 and inverters 73 and 75 are used to replace NAND gate 21. More specifically, inverter 73 is connected to receive signal oe, and provide an input signal to three-input NOR gate 71. NOR gate 71 is also connected to receive a complement version of data signal d from inverter 25 and to receive the output signal from delay circuit 22. Inverter 75 is connected to receive the output signal from NOR gate 71 and provide an input signal to the gate of PMOSFET 77.

Circuit 70 operates as follows. NAND gate 24, inverters 25 and 27 and delay circuit 26 operate as described above for in conjunction with FIG. 2 to drive the gate voltage of NMOSFET 13. NOR gate 71 and inverters 73 and 75 provide the proper polarity and edge delay to control PMOSFET 77 to be properly conductive or non-conductive in response to the data and oe signals.

Referring to NOR gate 71, when signal oe is deasserted, inverter 73 causes NOR gate 71 to receive a logic high level input signal. As a result, NOR gate 71 outputs a logic low level signal that is inverted by inverter 75 to turn off PMOSFET 77. When signal oe is asserted, NOR gate 71 functions essentially to invert data signal d. In addition, delay circuit 22 adds an additional delay in the high-to-low transition of the output signal generated by NOR gate 71. Consequently, when data signal d transitions, inverter 25, NOR gate 71 and inverter 75 propagate and invert the transition of data signal d to the gate of PMOSFET 77, with a delay on the falling edge (i.e., to delay turning on PMOSFET 77 relative to turning off PMOSFET 77). Thus, circuit 70 responds to signals d and oe to enter the high, low and high impedance states in the same way as circuit 20 (FIG. 2).

Although circuit 70 includes inverters 27 and 75 to drive the output transistors, those skilled in the art of output circuits, in light of this disclosure, can implement other embodiments without undue experimentation. For example, inverters 75 and 27 may be removed by complementing the input signals received by gates 71 and 24 and replacing NOR gate 71 with a three-input NAND gate and replacing NAND gate 24 with a three-input NOR gate. Complementing these gate input signals may be achieved by deleting inverter 25 and connecting inverter 73 so that the replacement NOR gate receives signal oe through inverter 73 while the replacement NAND gate receives signal oe directly.

The embodiments of the crow-bar reduction circuit described above are illustrative of the principles of the present invention and are not intended to limit the invention to the particular embodiments described. For example, in light of the present disclosure, those skilled in the art of output circuits can devise other implementations of the delay circuits instead of the cascaded inverters described. For example, delay can be achieved and/or adjusted by adding a capacitive load within the delay circuit or by altering the trip-points of inverting logic gates used to implement the delay circuit. In addition, those skilled in the art in light of this disclosure can implement GVC 15 (FIG. 3) using different logic gates that achieve the same function and delay. For example, each NAND gate of GVC 15 can be replaced with a NOR gate coupled to receive complemented versions of the NAND gate's input signals. Accordingly, while the preferred embodiment of the invention has been illustrated and described, it will be appreciated that various changes can be made therein without departing from the spirit and scope of the invention.

I claim:

1. A circuit comprising:

a first transistor;

a second transistor coupled to the first transistor at an output node such that a current path through the first and second transistors and the output node is formed when the first and second transistors are conductive;

a first input node configured to receive a data signal;

a second input node configured to receive an enable signal; and a logic circuit coupled to the first and second transistors and the first and second input nodes, the logic circuit comprising a first delay circuit and a second delay circuit, the first and second delay circuits being coupled to the first input node, wherein the logic circuit is configured to provide a first control signal to the first transistor and a second control signal to the second transistor, the first control signal being a function of an output signal of the first delay circuit and the data and enable signals, the second control signal being a function of an output signal of the second delay circuit and the data and enable signals, the first control signal being independent of the output signal of the second delay circuit, the second control signal is independent of the output signal of the first delay circuit, wherein the first and second control signals cause the first transistor to be substantially non-conductive before the second transistor becomes conductive and the second transistor to be substantially non-conductive before the first transistor becomes conductive.

2. The circuit of claim 1 wherein the logic circuit comprises a voltage boost circuit coupled to the logic circuit and the first transistor the voltage boost circuit selectively causing the first control signal to have a maximum magnitude greater than that of the second control signal.

3. The circuit of claim 2 wherein the first and second transistors are n-channel field effect transistors.

4. The circuit of claim 3 wherein the logic circuit is configured to delay rising edge transitions relative to falling edge transitions in the first and second control signals.

5. The circuit of claim 4 wherein the logic circuit comprises:
  a first NAND gate having first, second and third input leads and an output lead, the first input lead of the first NAND gate being coupled to the first input node, the second input lead of the first NAND gate being coupled to the second input node, the third input lead of the first NAND gate being coupled to an output lead of the first delay circuit, and the output lead of the first NAND gate being coupled to the voltage boost circuit;
  a first inverter having an input lead coupled to the first input node and having an output lead;
  a second NAND gate having first, second and third input leads and an output lead, the first input lead of the second NAND gate being coupled to the output lead of the first inverter, the second input lead of the second NAND gate being coupled to the second input node and the third input lead coupled to an output lead of the second delay circuit; and
  a second inverter having an input lead coupled to the output lead of the second NAND gate and having an output lead coupled to the second transistor.

6. The circuit of claim 5 wherein the first and second delay circuits each comprise an even number of cascaded inverters.

7. The circuit of claim 5 wherein the first NAND gate is skewed so that the first NAND gate generates an output signal such that a high-to-low transition is faster than a low-to-high transition.

8. The circuit of claim 5 wherein the second NAND gate is skewed so that the second NAND gate generates an output signal such that a high-to-low transition is slower than a low-to-high transition.

9. The circuit of claim 5 wherein the logic circuit further comprises a third NAND gate having first and second input leads and an output lead, the output lead of the third NAND gate being coupled to the voltage boost circuit, and the first and second input leads of the third NAND gate being coupled to the first and second input nodes, respectively.

10. The circuit of claim 9 wherein the voltage boost circuit comprises third and fourth transistors coupled at a boost node such that a current path through the boost node and the third and fourth transistors is formed when the third and fourth transistors are conductive, the third transistor being coupled to the output lead of the first NAND gate, the fourth transistor being coupled to the output lead of the third NAND gate and the boost node being coupled to the first transistor.

11. The circuit of claim 1 wherein the first and second transistors are p-channel and n-channel field effect transistors, respectively.

12. The circuit of claim 11 wherein the logic circuit is configured to delay falling edge transitions relative to rising edge transitions in the first control signal and rising edge transitions relative to falling edge transitions in the second control signal.

13. The circuit of claim 12 wherein the logic circuit comprises:
  a first inverter having an input lead coupled to the second input node and having an output lead;
  a NOR gate having first, second and third input leads and an output lead, the first input lead of the NOR gate being coupled to the first input node and the second input lead of the NOR gate being coupled to the output lead of the first inverter, and the third input lead of the NOR gate being coupled to an output lead of the first delay circuit;
  a second inverter having an input lead coupled to the output lead of the NOR gate and an output lead coupled to the first transistor;
  a third inverter having an input lead coupled to the first input node and having an output lead;
  a NAND gate having first, second and third input leads and an output lead, the first input lead of the NAND gate being coupled to the output lead of the third inverter, the second input lead of the NAND gate being coupled to the second input node and the third input lead of the NAND gate being coupled to an output lead of the second delay circuit; and
  a fourth inverter having an input lead coupled to the output lead of the NAND gate and having an output lead coupled to the second transistor.

14. A circuit comprising:
  a first transistor;
  a second transistor coupled to the first transistor at an output node such that a current path through the first and second transistors and the output node is formed when the first and second transistors are conductive;
  a first input node configured to receive a data signal;
  a second input node configured to receive an enable signal; and
  means, including a first delay circuit and a second delay circuit, each having an input lead coupled to the first input node for providing a first control signal to the first transistor and a second control signal to the second transistor, the first control signal being a function of an output signal of the first delay circuit and the data and enable signals, the second control signal being a function of an output signal of the second delay circuit and the data and enable signals, the first control signal being independent of the output signal of the second delay circuit, the second control signal is independent of the output signal of the first delay circuit, wherein the first and second control signals cause the first transistor to be substantially non-conductive before the second transistor becomes conductive and the second transistor to be substantially non-conductive before the first transistor becomes conductive.

15. The circuit of claim 14 wherein the first and second transistors are n-channel field effect transistors.

16. The circuit of claim 15 wherein the means for providing comprises a voltage boost circuit coupled to the logic circuit and the first transistor, the voltage boost circuit selectively causing the first control signal to have a maximum magnitude greater than that of the second control signal.

17. The circuit of claim 16 wherein the means for providing is configured to delay rising edge transitions relative to falling edge transitions in the first and second control signals.

18. The circuit of claim 17 wherein the means for providing further comprises:
   a first NAND gate having first, second and third input leads and an output lead, the first input lead of the first NAND gate being coupled to the first input node, the second input lead of the first NAND gate being coupled to the second input node, the third input lead of the first NAND gate being coupled to an output lead of the first delay circuit, and the output lead of the first NAND gate being coupled to the voltage boost circuit;
   a first inverter having an input lead coupled to the first input node and having an output lead;
   a second NAND gate having first, second and third input leads and an output lead, the first input lead of the second NAND gate being coupled to the output lead of the first inverter, the second input lead of the second NAND gate being coupled to the second input node and the third input lead coupled to an output lead of the second delay circuit; and
   a second inverter having an input lead coupled to the output lead of the second NAND gate and having an output lead coupled to the second transistor.

19. The circuit of claim 18 wherein the first NAND gate is skewed so that the first NAND gate generates an output signal such that a high-to-low transition is faster than a low-to-high transition.

20. The circuit of claim 18 wherein the second NAND gate is skewed so that the second NAND gate generates an output signal such that a high-to-low transition is slower than a low-to-high transition.

21. The circuit of claim 18 wherein the means for providing further comprises a third NAND gate having first and second input leads and an output lead, the first and second input leads of the third NAND gate being coupled to the first and second input nodes, respectively and the output lead of the third NAND gate being coupled to the voltage boost circuit.

22. The circuit of claim 21 wherein the voltage boost circuit comprises third and fourth transistors coupled at a boost node such that a current path through the boost node and the third and fourth transistors is formed when the third and fourth transistors are conductive, the third transistor being coupled to the output lead of the first NAND gate, the fourth transistor being coupled to the output lead of the third NAND gate and the boost node being coupled to the first transistor.

23. The circuit of claim 14 wherein the means for providing is configured to delay falling edge transitions relative to rising edge transitions in the first control signal and rising edge transitions relative to falling edge transitions in the second control signal.

24. The circuit of claim 23 wherein the means for providing comprises:
   a first inverter having an input lead coupled to the second input node and having an output lead;
   a NOR gate having first, second and third input leads and an output lead, the first input lead of the NOR gate being coupled to the first input node and the second input lead of the NOR gate being coupled to the output lead of the first inverter, and the third input lead of the NOR gate being coupled to an output lead of the first delay circuit;
   a second inverter having an input lead coupled to the output lead of the NOR gate and an output lead coupled to the first transistor;
   a third inverter having an input lead coupled to the first input node and having an output lead;
   a NAND gate having first, second and third input leads and an output lead, the first input lead of the NAND gate being coupled to the output lead of the third inverter, the second input lead of the NAND gate being coupled to the second input node and the third input lead of the NAND gate being coupled to an output lead of the second delay circuit; and
   a fourth inverter having an input lead coupled to the output lead of the NAND gate and having an output lead coupled to the second transistor.

25. A circuit comprising:
   a first transistor;
   a second transistor coupled to the first transistor at an output node such that a current path through the first and second transistors and the output node is formed when the first and second transistors are conductive;
   a first input node configured to receive a data signal;
   a second input node configured to receive an enable signal; and
   a logic circuit coupled to the first and second transistors and the first and second input nodes, wherein the logic circuit is configured to provide in response to the data and enable signals a first control signal to the first transistor and a second control signal to the second transistor, wherein the first and second control signals cause the first transistor to be substantially non-conductive before the second transistor becomes conductive and the second transistor to be substantially non-conductive before the first transistor becomes conductive, wherein the logic circuit comprises:
      a first NAND gate having first, second and third input leads and an output lead, the first input lead of the first NAND gate being coupled to the first input node, the second input lead of the first NAND gate being coupled to the second input node and the output lead of the first NAND gate being coupled to the voltage boost circuit;
      a first delay circuit having an input lead coupled to the first input node and having an output lead coupled to the third input lead of the first NAND gate;
   a first inverter having an input lead coupled to the first node and having an output lead;
      a second delay circuit having an input lead coupled to the first node and having an output lead;
      a second NAND gate having first, second and third input leads and an output lead, the first input lead of the second NAND gate being coupled to the output lead of the first inverter, the second input lead of the second NAND gate being coupled to the second input node and the third input lead coupled to the output lead of the second delay circuit; and
      a second inverter having an input lead coupled to the output lead of the second NAND gate and having an output lead coupled to the second transistor.

26. A circuit comprising:
   a first transistor;
   a second transistor coupled to the first transistor at an output node such that a current path through the first and second transistors and the output node is formed when the first and second transistors are conductive;

a first input node configured to receive a data signal;

a second input node configured to receive an enable signal; and a logic circuit coupled to the first and second transistors and the first and second input nodes, wherein the logic circuit is configured to provide in response to the data and enable signals a first control signal to the first transistor and a second control signal to the second transistor, wherein the first and second control signals cause the first transistor to be substantially non-conductive before the second transistor becomes conductive and the second transistor to be substantially non-conductive before the first transistor becomes conductive, wherein the logic circuit comprises:

a first inverter having an input lead coupled to the second node and having an output lead;

a NOR gate having first, second and third input leads and an output lead, the first input lead of the NOR gate being coupled to the first input node and the second input lead of the first NOR gate being coupled to the output lead of the first inverter;

a second inverter having an input lead coupled to the output lead of the NOR gate and an output lead coupled to the first transistor;

a first delay circuit having an input lead coupled to the first input node and having an output lead coupled to the third input lead of the NOR gate;

a third inverter having an input lead coupled to the first node and having an output lead;

a second delay circuit having an input lead coupled to the first node and having an output lead;

a NAND gate having first, second and third input leads and an output lead, the first input lead of the NAND gate being coupled to the output lead of the third inverter, the second input lead of the NAND gate being coupled to the second input node and the third input lead of the NAND gate being coupled to the output lead of the second delay circuit; and a fourth inverter having an input lead coupled to the output lead of the NAND gate and having an output lead coupled to the second transistor.

* * * * *